US009941363B2

(12) United States Patent
Cheng et al.

(10) Patent No.: US 9,941,363 B2
(45) Date of Patent: Apr. 10, 2018

(54) III-V TRANSISTOR DEVICE WITH SELF-ALIGNED DOPED BOTTOM BARRIER

(71) Applicant: INTERNATIONAL BUSINESS MACHINES CORPORATION, Armonk, NY (US)

(72) Inventors: Cheng-Wei Cheng, White Plains, NY (US); Pranita Kerber, Mount Kisco, NY (US); Amlan Majumdar, White Plains, NY (US); Yanning Sun, Scarsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/974,162

(22) Filed: Dec. 18, 2015

(65) Prior Publication Data

US 2017/0179288 A1  Jun. 22, 2017

(51) Int. Cl.
*H01L 29/207* (2006.01)
*H01L 29/66* (2006.01)
(Continued)

(52) U.S. Cl.
CPC ........ *H01L 29/207* (2013.01); *H01L 21/2654* (2013.01); *H01L 21/26586* (2013.01);
(Continued)

(58) Field of Classification Search
CPC .......... H01L 29/66636; H01L 29/7849; H01L 29/452; H01L 29/41783; H01L 29/7848; H01L 29/0878; H01L 29/205; H01L 29/66689; H01L 29/7816; H01L 29/66522; H01L 29/086; H01L 29/207; H01L 29/665; H01L 29/6656; H01L 29/511; H01L 29/49; H01L 21/02538; H01L 21/30612; H01L 21/26586; H01L 21/76224; H01L 21/2654; H01L 21/02639; H01L 29/6653
See application file for complete search history.

(56) References Cited

U.S. PATENT DOCUMENTS 5,212,113 A    5/1993  Azoulay et al.
6,121,153 A    9/2000  Kikkawa
(Continued)

OTHER PUBLICATIONS

Cheng-Wei Cheng, et al.,"III-V Transistor Device With Doped Bottom Barrier", U.S. Appl. No. 14/974,182, filed Dec. 18, 2015.
(Continued)

*Primary Examiner* — Lauren R Bell
(74) *Attorney, Agent, or Firm* — Cantor Colburn LLP; Louis Percello

(57) ABSTRACT

A semiconductor device comprises a first layer of a substrate arranged on a second layer of the substrate the second layer of the substrate including a doped III-V semiconductor material barrier layer, a gate stack arranged on a channel region of the first layer of a substrate, a spacer arranged adjacent to the gate stack on the first layer of the substrate, an undoped epitaxially grown III-V semiconductor material region arranged on the second layer of the substrate, and an epitaxially grown source/drain region arranged on the undoped epitaxially grown III-V semiconductor material region, and a portion of the first layer of the substrate.

20 Claims, 7 Drawing Sheets

(51) Int. Cl.

| | | |
|---|---|---|
| *H01L 21/306* | (2006.01) | |
| *H01L 21/762* | (2006.01) | |
| *H01L 29/51* | (2006.01) | |
| *H01L 29/205* | (2006.01) | |
| *H01L 29/45* | (2006.01) | |
| *H01L 29/417* | (2006.01) | |
| *H01L 21/265* | (2006.01) | |
| *H01L 29/78* | (2006.01) | |

(52) U.S. Cl.
CPC .. *H01L 21/30612* (2013.01); *H01L 21/76224* (2013.01); *H01L 29/205* (2013.01); *H01L 29/41783* (2013.01); *H01L 29/452* (2013.01); *H01L 29/511* (2013.01); *H01L 29/665* (2013.01); *H01L 29/6653* (2013.01); *H01L 29/6656* (2013.01); *H01L 29/66522* (2013.01); *H01L 29/7834* (2013.01)

(56) References Cited

U.S. PATENT DOCUMENTS

| | | | |
|---|---|---|---|
| 7,838,392 B2 | 11/2010 | Langdo et al. | |
| 7,919,791 B2 | 4/2011 | Flynn et al. | |
| 8,288,798 B2 | 10/2012 | Passlack | |
| 8,455,860 B2 | 6/2013 | Ko et al. | |
| 8,592,264 B2 * | 11/2013 | Ando | H01L 29/78621 257/408 |
| 2008/0067545 A1 * | 3/2008 | Rhee | H01L 21/26513 257/190 |
| 2008/0169490 A1 * | 7/2008 | Kawai | H01L 21/84 257/288 |
| 2010/0148153 A1 | 6/2010 | Hudait et al. | |
| 2010/0264469 A1 * | 10/2010 | Zhu | B82Y 10/00 257/288 |
| 2010/0320546 A1 * | 12/2010 | Tamura | H01L 21/26506 257/408 |
| 2011/0070719 A1 * | 3/2011 | Schwartz | H01L 21/2652 438/423 |
| 2012/0319166 A1 * | 12/2012 | Adam | H01L 29/66636 257/192 |
| 2013/0032859 A1 * | 2/2013 | Pei | H01L 29/6656 257/192 |
| 2014/0187008 A1 * | 7/2014 | Bo | H01L 21/266 438/289 |
| 2014/0246696 A1 * | 9/2014 | Flachowsky | H01L 29/7848 257/190 |
| 2014/0346600 A1 * | 11/2014 | Cheng | H01L 29/7849 257/347 |
| 2015/0137193 A1 * | 5/2015 | Cheng | H01L 29/7842 257/288 |

OTHER PUBLICATIONS

List of IBM Patents or Patent Applications Treated as Related; Date Filed: Dec. 18, 2015, p. 1-2.

* cited by examiner

III-V TRANSISTOR DEVICE WITH SELF-ALIGNED DOPED BOTTOM BARRIER

BACKGROUND

The present invention generally relates to metal oxide semiconductor field effect transistor (MOSFET) devices, and more specifically, to MOSFET devices with a doped bottom barrier layer.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

In conventional III-V MOSFET devices, short-channel effects are improved by incorporating a heavily doped p-type bottom barrier layer. The heavily doped p-type bottom barrier layer is often epitaxially grown entirely under the source/drain contact region.

SUMMARY

According to an embodiment of the present invention, a method for forming a semiconductor device comprises removing portions of a first layer of a substrate to expose portions of a second layer of the substrate, the first layer of the substrate arranged on the second layer of the substrate, depositing an insulator material over exposed portions of the second layer of the substrate, forming a gate stack on a channel region of first layer of the substrate, forming a first spacer adjacent to the gate stack, removing exposed portions of the first layer of the substrate to form a cavity partially defined by the first layer of the substrate and the insulator material, forming a second spacer along sidewalls of the first spacer and in the cavity, removing exposed portions of the first layer of the substrate and the second layer of the substrate to increase a depth of the cavity, epitaxially growing a first semiconductor material on exposed portions of the second layer of the substrate in the cavity, and epitaxially growing a raised source/drain region comprising a second semiconductor material on the first semiconductor material.

According to another embodiment of the present invention, a method for forming a semiconductor device comprises removing portions of a first layer of a substrate to expose portions of a second layer of the substrate, the first layer of the substrate arranged on the second layer of the substrate, depositing an insulator material over exposed portions of the second layer of the substrate, forming a gate stack on a channel region of first layer of the substrate, forming a first spacer adjacent to the gate stack, implanting dopants in the first layer of the substrate to form a source/drain extension region in the first layer of the substrate, removing exposed portions of the first layer of the substrate including portions of the source/drain extension region to form a cavity partially defined by the first layer of the substrate and the insulator material, forming a second spacer along sidewalls of the first spacer and in the cavity, removing exposed portions of the first layer of the substrate and the second layer of the substrate to increase a depth of the cavity, epitaxially growing a first semiconductor material on exposed portions of the second layer of the substrate in the cavity, and epitaxially growing a raised source/drain region comprising a second semiconductor material on the first semiconductor material.

According to yet another embodiment of the present invention, a semiconductor device comprises a first layer of a substrate arranged on a second layer of the substrate the second layer of the substrate including a doped III-V semiconductor material barrier layer, a gate stack arranged on a channel region of the first layer of a substrate, a spacer arranged adjacent to the gate stack on the first layer of the substrate, an undoped epitaxially grown III-V semiconductor material region arranged on the second layer of the substrate, and an epitaxially grown source/drain region arranged on the undoped epitaxially grown III-V semiconductor material region, and a portion of the first layer of the substrate.

BRIEF DESCRIPTION OF THE DRAWINGS

FIG. 1 illustrates a cutaway view of a substrate layer.

FIG. 2 illustrates a cutaway view following a lithographic patterning and etching process.

FIG. 3 illustrates a cutaway view following the formation of shallow trench isolation (STI) regions.

FIG. 4 illustrates a top view of the III-V channel layer, the gate stack and the spacers.

FIG. 5 illustrates a cutaway view along the line A-A of FIG. 4 following the formation of a gate stack and spacers.

FIG. 6 illustrates a cutaway view following the formation of source/drain extension regions.

FIG. 7 illustrates a cutaway view of the removal of exposed portions of the III-V channel layer.

FIG. 8 illustrates a cutaway view of the formation of a second set of spacers.

FIG. 9 illustrates a cutaway view of the resultant structure following an anisotropic etching process.

FIG. 10 illustrates a cutaway view of the formation of an undoped epitaxially grown III-V material.

FIG. 11 illustrates a cutaway view of the resultant structure following the removal of the spacers.

FIG. 12 illustrates a cutaway view of the resultant structure following the formation of raised source/drain regions.

FIG. 13 illustrates a cutaway view following the formation of a silicide over portions of the raised source/drain regions.

FIG. 14 illustrates a cutaway view of the resultant MOSFET device following the formation of contacts.

DETAILED DESCRIPTION

Figure 1:
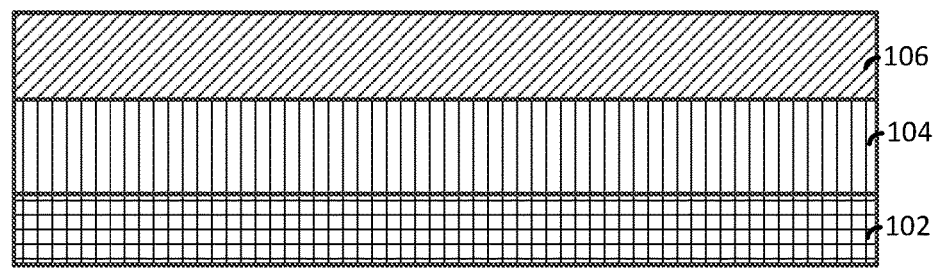
FIGS. 1-14 illustrate an exemplary method for forming an exemplary embodiment of a MOSFET device.

As discussed above, conventional III-V MOSFET devices, short-channel effects are improved by incorporating a heavily doped p-type bottom barrier layer. The heavily doped p-type bottom barrier layer is often epitaxially grown entirely under the source/drain contact region.

The embodiments described herein provide for III-V MOSFET structures with a p-type doped bottom barrier layer that is self-aligned to the channel region below the gate. The embodiments described herein have desirably low junction capacitance and low band-to-band tunneling currents in the off state in low-bandgap III-V materials.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIGS. 1-14 illustrate an exemplary method for forming an exemplary embodiment of a MOSFET device.

In this regard, FIG. 1 illustrates a cutaway view of a substrate layer 102. Non-limiting examples of suitable substrate materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates include silicon-on-insulator (SOI) substrates with buried oxide (BOX) layers. A III-V material bottom barrier layer 104 is arranged on the substrate 102. A group III-V material includes, for example, group III elements (e.g., Al, Ga, and In) combined with group V elements (e.g., N, P, As, and Sb). The III-V material bottom barrier layer 104 may be formed by, for example, an epitaxial growth process with dopants that are imbedded in the III-V material bottom barrier layer 104 during (in-situ) the epitaxial growth process or following the epitaxial growth process using ion implantation. The III-V material bottom barrier layer 104 has a relatively high concentration of dopants of greater than about $10^{19}$ per cubic centimeter. A III-V channel layer 106 is formed on the III-V material bottom barrier layer 104.

Figure 2:
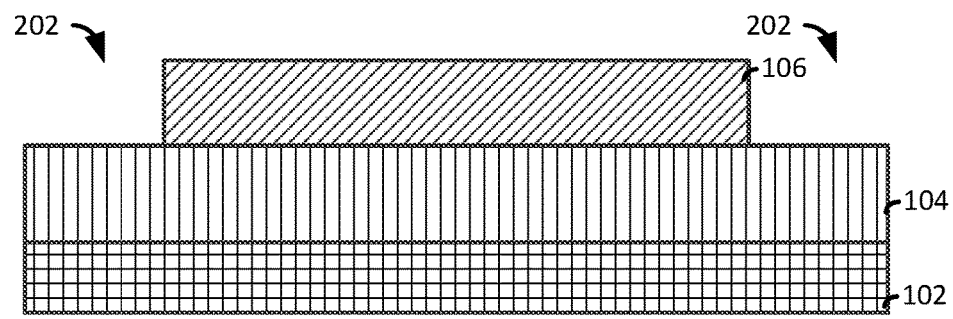

FIG. 2. illustrates a cutaway view following a lithographic patterning and etching process such as, for example, reactive ion etching that removes portions of the III-V channel layer 106 and exposes portions of the III-V material bottom barrier layer 104 to define trenches 202.

Figure 3:
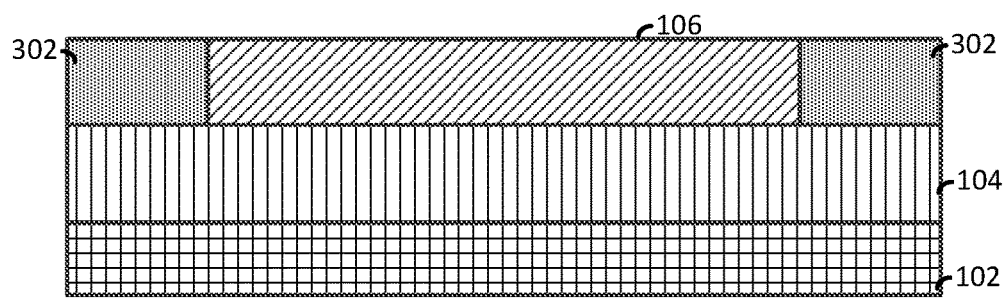

FIG. 3 illustrates a cutaway view following the formation of shallow trench isolation (STI) regions 302. The STI regions 302 are formed by filling the trenches 202 (of FIG. 2) with, for example, an insulating material such as an oxide material. Alternatively, the trenches may be lined with a silicon dioxide liner formed by a thermal oxidation process and then filled with additional silicon dioxide or another material.

Non-limiting examples of suitable oxide materials for the STI regions 302 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof.

Figure 4:
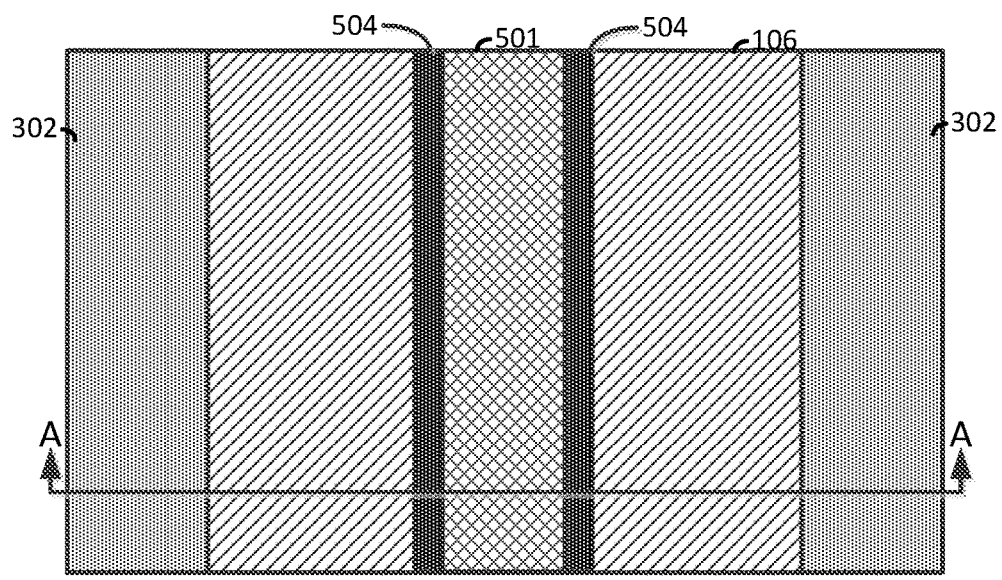

FIG. 4 illustrates a top view of the III-V channel layer 106, the gate stack 501 and the spacers 504 described below.

Figure 5:
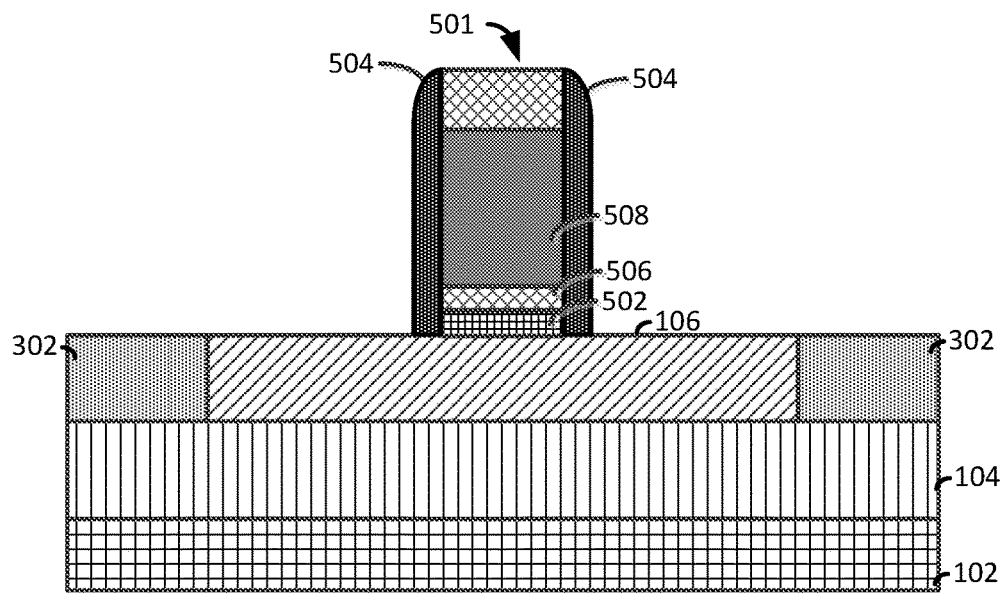

FIG. 5 illustrates a cutaway view along the line A-A of FIG. 4 following the formation of a gate stack 501 and spacers 504 adjacent to the sidewalls of the gate stack 501.

In this regard, the gate stack 501 includes a high-k metal gate formed, for example, by depositing and patterning one or more high-k dielectric layers 502, one or more workfunction metals 506, a semiconductor layer 508 and a hardmask layer 510. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer 502 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer 502 may have a thickness in a range from about 0.5 to about 20 nm.

The work function metal(s) 506 may be disposed over the high-k dielectric material. The type of work function metal(s) depends on the type of transistor and may differ between an nFET and a pFET. Non-limiting examples of suitable work function metals 206 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

Non-limiting examples of suitable materials for the hard mask layer 510 include silicon oxide, silicon nitride, or any combination thereof. The thickness of the hard mask layer 510 is not intended to be limited.

The spacers 504 may be formed by, for example, depositing a layer of spacer material over exposed portions of the III-V channel layer 106 and over the gate stack 501. The spacer material can be any dielectric spacer material. Non-limiting examples of suitable materials for the spacers 504 include dielectric oxides (e.g., silicon oxide), dielectric nitrides (e.g., silicon nitride), dielectric oxynitrides, or any combination thereof. The spacer material is deposited by a deposition process, for example, chemical vapor deposition (CVD) or physical vapor deposition (PVD). Following the deposition of the spacer material, an etching process such as, for example reactive ion etching is performed that removes portions of the spacer material to form the spacers 504.

Figure 6:
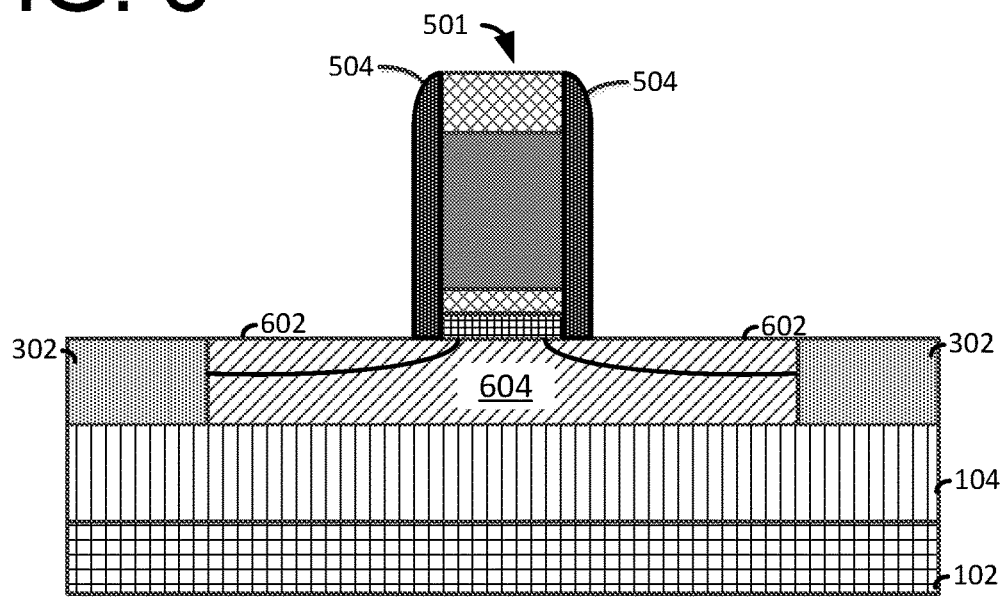

FIG. 6 illustrates a cutaway view following the formation of source/drain extension regions 602 that are formed in the III-V channel layer 106. The source/drain extension regions 602 may be formed by, for example, an ion implantation process that may be performed at an angle to imbed n-type (or in some embodiments, p-type dopants) to provide a doped region of the III-V channel layer 106 under the spacers 504 and partially under the gate stack 201. A channel region 604 is defined under the gate stack 201.

Figure 7:
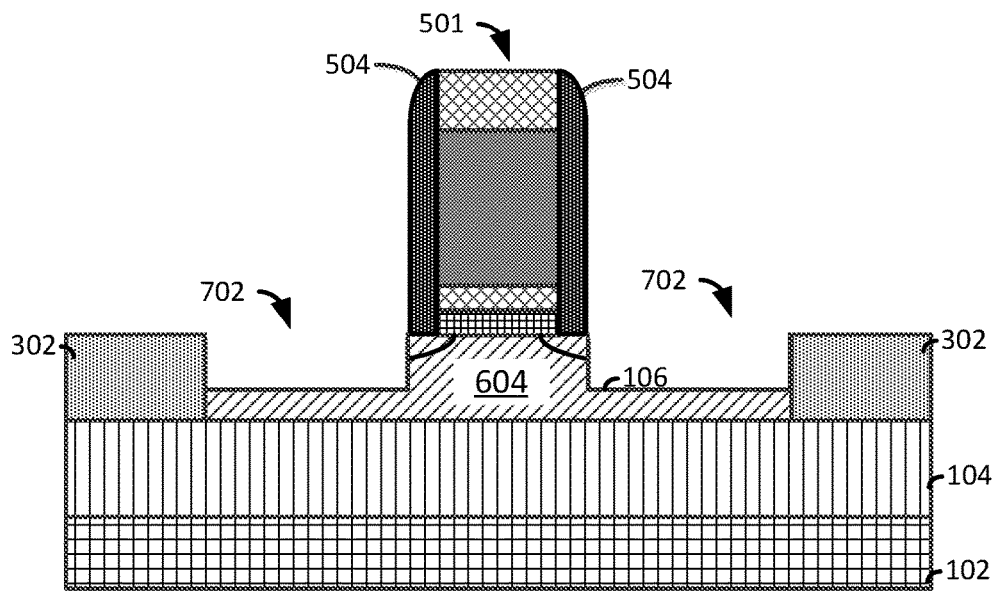

FIG. 7 illustrates a cutaway view of the removal of exposed portions of the III-V channel layer 106 using, for example, a selective anisotropic etching process such as reactive ion etching. The etching process removes a portion of the III-V channel layer 106 to form cavities 702 adjacent to the spacers 504.

Figure 8:
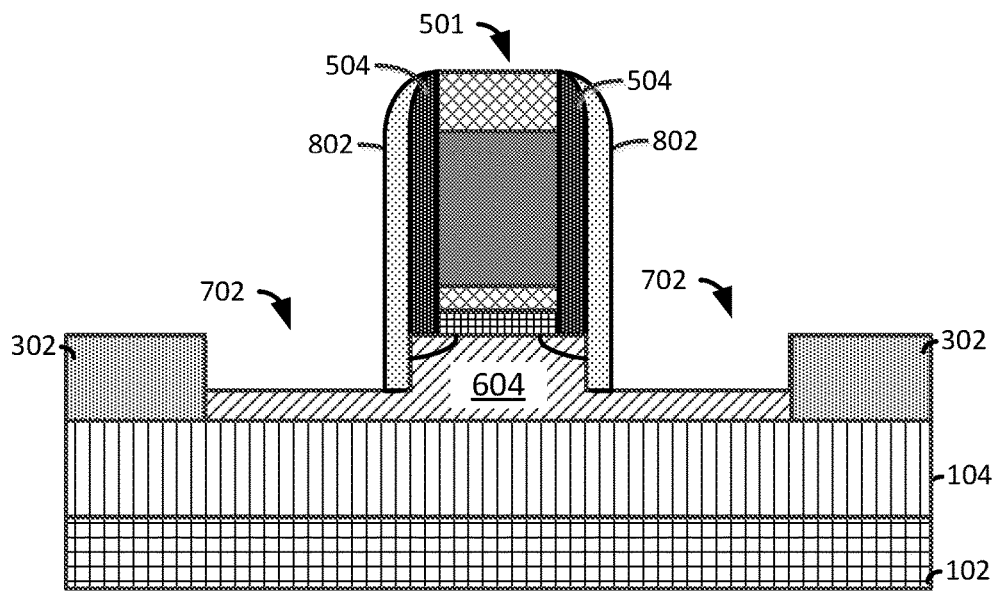

FIG. 8 illustrates a cutaway view of the formation of a second set of spacers 802. The second set of spacers 802 are formed by, for example, depositing a layer of spacer material over the STI regions 302, the cavities 702, the spacers 504, and the gate stack 501. Following the deposition process, an etching process, such as, for example, reactive ion etching may be used to form the second set of spacers 802 along sidewalls of the spacers 504 and in the cavities 702. In the illustrated embodiment, the material for the spacers 504 is dissimilar from the material in the spacers 802 to provide for selectively etching to remove the spacers 802 without substantially removing the spacers 504 in a subsequent etching process that is described below. For example, the spacers 802 may include an oxide material while the spacers 504 include a nitride material. Alternately, the spacers 504 may include a nitride (e.g., SiN) deposited at a relatively high temperature, while the spacers 802 may include a nitride (e.g., SiN) deposited at a relatively low temperature.

Figure 9:
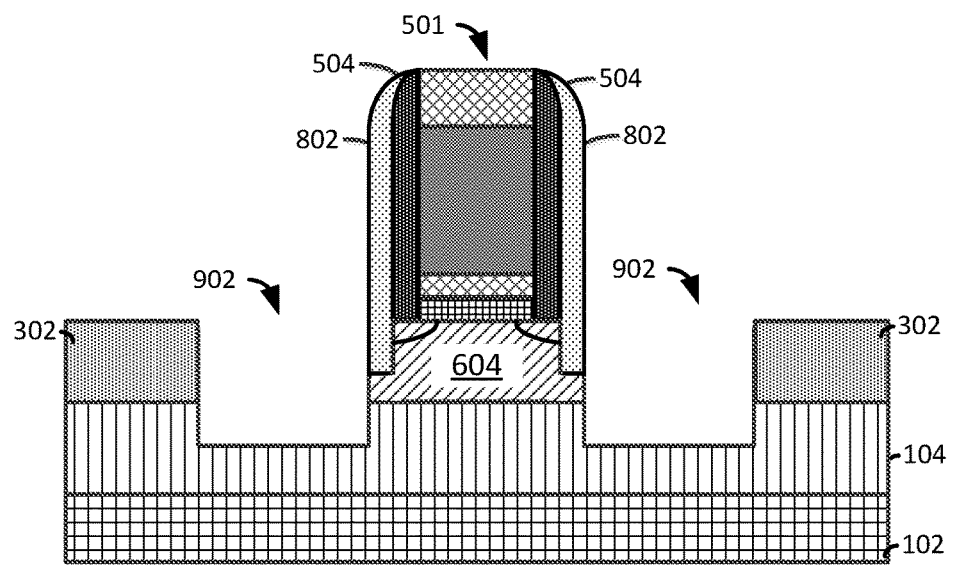

FIG. 9 illustrates a cutaway view of the resultant structure following an anisotropic etching process that removes exposed portions of the III-V channel layer 106 in the cavities 702 and exposes and removes portions of the III-V material bottom barrier layer 104 to form the cavities 902 that are partially defined by portions of the III-V material bottom barrier layer 104, the III-V channel layer 106, the STI regions 302, and the spacers 802. The anisotropic etching process may include, for example, a timed reactive ion etching process.

Figure 10:
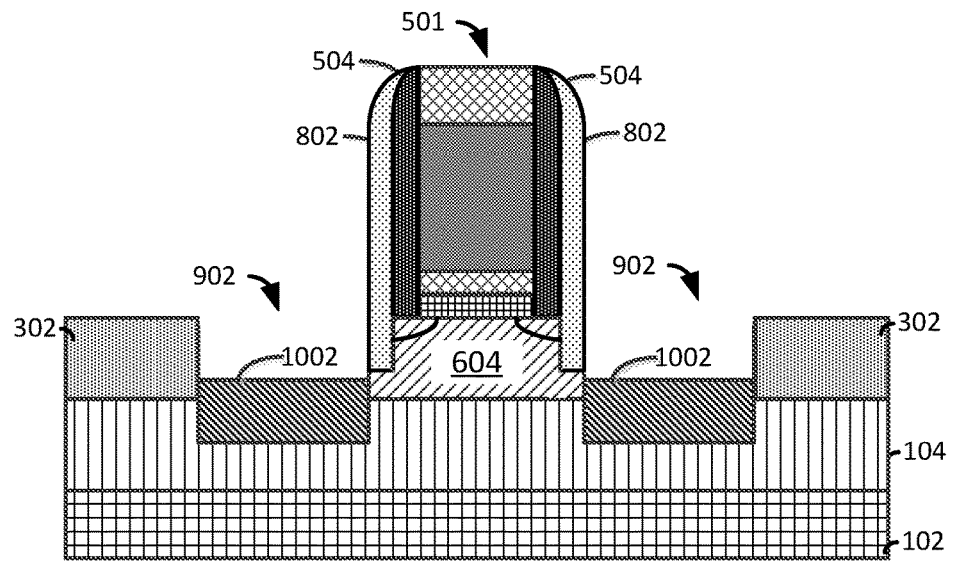

FIG. 10 illustrates a cutaway view of the formation of an undoped epitaxially grown III-V material 1002. The epitaxially grown III-V material 1002 is formed using an epitaxial growth process that is seeded by the exposed portions of the III-V material bottom barrier layer 104 in the cavities 902. The undoped epitaxial III-V material 1002 is an undoped bottom barrier layer. It is a semiconductor material with electron affinity that is less than the electron affinity of the channel layer 106 such that the conduction band of the channel layer 106 is lower in energy than the conduction band of the undoped bottom barrier layers 1002. Therefore, the higher-energy undoped bottom barrier layers 1002 acts as energy barriers and the conduction electrons are confined to the lower-energy channel layer 106. Examples of channel/barrier material combinations are, but not limited to, InGaAs/InAlAs, InGaAs/AlGaAs, InGaAs/InP, InAs/InAlAs, InAs/AlGaAs, and InAs/InP.

Figure 11:
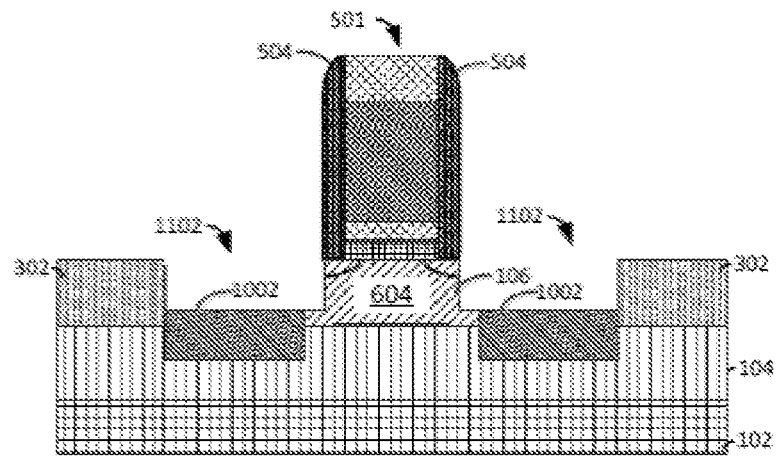

FIG. 11 illustrates a cutaway view of the resultant structure following the removal of the spacers 802, which exposes portions of the spacers 504, and the III-V channel layer 106. Since the spacers 802 and 504 are formed from dissimilar materials or materials formed by different deposition processes, the spacers 802 may be removed using a selective etching process that removes the spacers 802 without substantially removing other materials such as the spacers 504.

Figure 12:
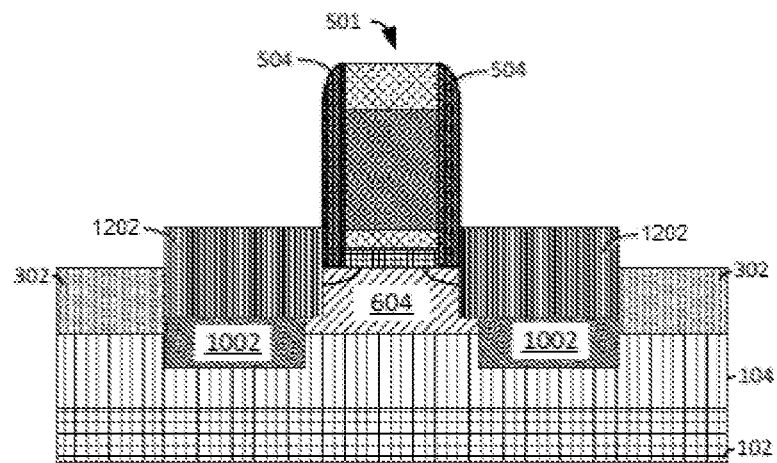

FIG. 12 illustrates a cutaway view of the resultant structure following the formation of raised source/drain regions 1202 on exposed portions of the III-V channel layer 106, and the epitaxially grown III-V material 1002 in the cavities 902 (of FIG. 11). The raised source/drain regions 1202 may be formed by, for example, an epitaxial growth process. The underlying III-V channel layer 1202 and/or the epitaxially grown III-V material 1002 acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor. Alternatively, following the epitaxial growth process, the raised source/drain regions 1202 may be doped using an ion implantation process.

Figure 13:
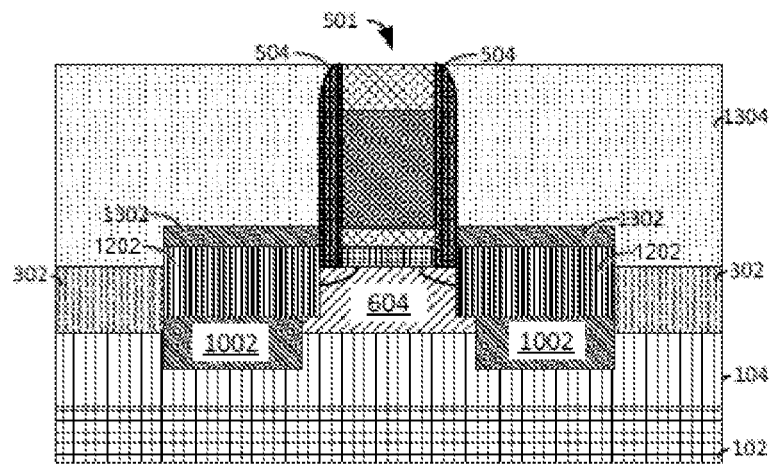

FIG. 13 illustrates a cutaway view following the formation of a silicide 1302 over portions of the raised source/drain regions 1202. To form the silicide 1302, a metallic film is deposited and annealed. The metallic film can be deposited by performing an evaporation process or a sputtering process. The metallic film is annealed by heating inside a furnace or performing a rapid thermal treatment in an atmosphere containing pure inert gases (e.g., nitrogen or argon) so that the metal reacts with exposed silicon in the substrate raised source/drain regions 1202 to form the metal silicide 1302 layer. Non-limiting examples of suitable metal silicide materials include titanium silicide, tungsten silicide, cobalt silicide, nickel silicide, molybdenum silicide, platinum silicide, or any combination thereof.

Following the formation of the metal silicide layer 1302, an inter-level dielectric (ILD) layer 1304 is formed over the exposed portions of the STI region 502, the raised source/ drain regions 1202, silicide layer 1302, and the spacers 504. The ILD layer 1304 may be formed from, for example, a low-k dielectric oxide, including but not limited to, silicon dioxide, spin-on-glass, a flowable oxide, a high density plasma oxide, borophosphosilicate glass (BPSG), or any combination thereof. The ILD layer 1304 may further comprise a liner (e.g., silicon nitride) (not shown) that is deposited before the oxide.

Figure 14:
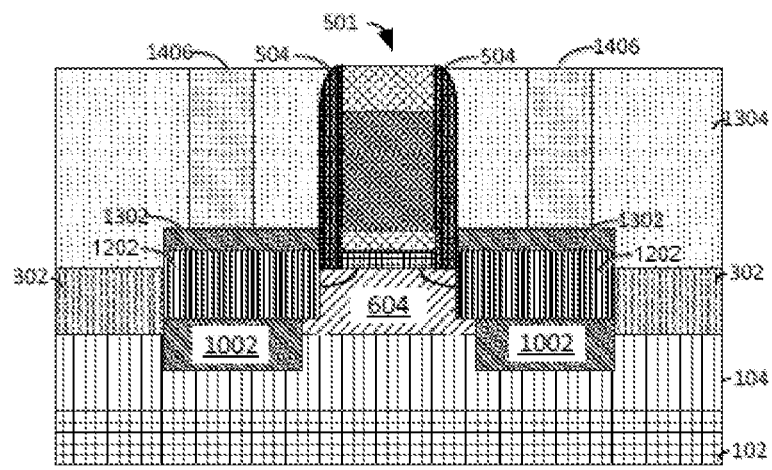

FIG. 14 illustrates a cutaway view of the resultant MOSFET device following the formation of contacts 1406. The contacts 1406 are formed by forming contact trenches (not shown) in the ILD layer 1304 that expose portions of the silicide 1302 using a suitable patterning and etching process such as, for example, reactive ion etching. Following the formation of the contact trenches, a liner layer (not shown) may be deposited in the contact trenches. Conductive material is deposited in the contact trenches and planarized using a planarization process such as, for example, chemical mechanical polishing that defines the contacts 1406. The conductive material may include, for example, copper, aluminum, silver, or other suitable conductive materials.

The embodiments described herein provide for III-V MOSFET structures with a p-type doped bottom barrier layer that is self-aligned to the channel region below the gate. The embodiments described herein have desirably low junction capacitance and low band-to-band tunneling currents in the off state in low-bandgap III-V materials.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:
    removing first portions of a first layer of a substrate to expose first portions of a second layer of the substrate, the first layer of the substrate arranged on the second layer of the substrate, each of the first layer of the substrate and the second layer of the substrate including a different III-V semiconductor material;
    depositing an insulator material over the first portions of the second layer of the substrate;
    forming a gate stack on a channel region of the first layer of the substrate;
    forming a first spacer adjacent to the gate stack;
    removing exposed second portions of the first layer of the substrate to form a cavity defined by the first layer of the substrate and the insulator material;
    forming a second spacer along sidewalls of the first spacer and in the cavity;
    after forming the second spacer, performing an anisotropic etching process to remove exposed third portions of the first layer of the substrate and to remove second portions of the second layer of the substrate to increase a depth of the cavity, a sidewall of the cavity being substantially coplanar with the second spacer after the anisotropic etching process, the sidewall of the cavity being defined by a remaining portion of the first layer and a remaining portion of the second layer;
    epitaxially growing a first semiconductor material on exposed third portions of the second layer of the substrate in the cavity; and
    epitaxially growing a raised source/drain region comprising a second semiconductor material on the first semiconductor material.

2. The method of claim 1, wherein the gate stack is a metal gate stack.

3. The method of claim 1, wherein the first spacer comprises a first material and the second spacer comprises a second material, the first material dissimilar from the second material.

4. The method of claim 1, wherein:
    the first semiconductor material includes an undoped epitaxially grown III-V semiconductor material and the second semiconductor material includes an epitaxially in-situ doped semiconductor material; and
    the first semiconductor material directly contacts the channel region.

5. The method of claim 1, further comprising forming a silicide material on the raised source/drain region.

6. The method of claim 1, further comprising forming a dielectric layer on the insulator layer, the raised/source drain region, and the first spacer.

7. The method of claim 1, further comprising forming a doped source/drain extension region in the first layer of the substrate prior to forming the cavity, wherein the doped source/drain extension region is formed using an angled ion implantation process.

8. The method of claim 1, wherein the second layer of the substrate includes p-type dopants.

9. The method of claim 1, wherein:
    the first layer of the substrate is arranged on an uppermost surface of the second layer of the substrate;
    the epitaxially growing the first semiconductor material on the exposed third portions of the second layer of the substrate in the cavity includes epitaxially growing the first semiconductor material directly on an uppermost surface of the exposed third portions of the second layer of the substrate in the cavity;
    the uppermost surface of the exposed third portions of the second layer of the substrate are substantially parallel to the uppermost surface of the second layer of the substrate upon which the first layer of the substrate is arranged;
    the epitaxially growing the raised source/drain region comprising the second semiconductor material on the first semiconductor material includes epitaxially growing the raised source/drain region comprising the second semiconductor material directly on an uppermost surface of the first semiconductor material;
    the uppermost surface of the first semiconductor material is substantially parallel to the uppermost surface of the second layer of the substrate upon which the first layer of the substrate is arranged; and
    the sidewall of the cavity is substantially orthogonal to the uppermost surface of the second layer of the substrate upon which the first layer of the substrate is arranged.

10. The method of claim 1, wherein the first layer of the substrate includes one of InGaAs and InAs.

11. The method of claim 10, wherein the second layer of the substrate includes one of InAlAs, AlGaAs, and InP.

12. The method of claim 1, wherein the second layer of the substrate includes one of InAlAs, AlGaAs, and InP.

13. A method for forming a semiconductor device, the method comprising:

removing first portions of a first layer of a substrate to expose first portions of a second layer of the substrate, the first layer of the substrate arranged on the second layer of the substrate, each of the first layer of the substrate and the second layer of the substrate including a different III-V semiconductor material;

depositing an insulator material over the first portions of the second layer of the substrate;

forming a gate stack on a channel region of the first layer of the substrate;

forming a first spacer adjacent to the gate stack;

implanting dopants in the first layer of the substrate to form a source/drain extension region in the first layer of the substrate;

removing exposed second portions of the first layer of the substrate including portions of the source/drain extension region to form a cavity defined by the first layer of the substrate and the insulator material;

forming a second spacer along sidewalls of the first spacer and in the cavity;

after forming the second spacer, performing an anisotropic etching process to remove exposed third portions of the first layer of the substrate and to remove second portions of the second layer of the substrate to increase a depth of the cavity, a sidewall of the cavity being substantially coplanar with the second spacer after the anisotropic etching process, the sidewall of the cavity being defined by a remaining portion of the first layer and a remaining portion of the second layer;

epitaxially growing a first semiconductor material on exposed third portions of the second layer of the substrate in the cavity; and epitaxially growing a raised source/drain region comprising a second semiconductor material on the first semiconductor material.

14. The method of claim 13, wherein the gate stack is a metal gate stack.

15. The method of claim 13, wherein the first spacer comprises a first material and the second spacer comprises a second material, the first material dissimilar from the second material.

16. The method of claim 13, wherein:

the first semiconductor material includes an undoped epitaxially grown III-V semiconductor material and the second semiconductor material includes an epitaxially in-situ doped semiconductor material; and the first semiconductor material directly contacts the channel region.

17. The method of claim 13, further comprising forming a silicide material on the raised source/drain region.

18. The method of claim 13, further comprising forming a dielectric layer on the insulator layer, the raised/source drain region, and the first spacer.

19. The method of claim 13, wherein the second layer of the substrate includes p-type dopants.

20. A method for forming a semiconductor device, the method comprising:

removing first portions of a first layer of a substrate to expose first portions of a second layer of the substrate, each of the first layer of the substrate and the second layer of the substrate including a different III-V semiconductor material;

depositing an insulator material over the first portions of the second layer of the substrate;

forming a gate stack on a channel region of the first layer of the substrate;

forming a first spacer adjacent to the gate stack;

removing exposed second portions of the first layer of the substrate to form a cavity partially defined by the first layer of the substrate and the insulator material;

forming a second spacer along sidewalls of the first spacer and in the cavity;

performing an anisotropic etching process to remove exposed third portions of the first layer of the substrate and to remove second portions of the second layer of the substrate to increase a depth of the cavity and expose third portions of the second layer of the substrate in the cavity, a sidewall of the cavity being substantially orthogonal to an upper surface of the exposed third portions of the second layer of the substrate after the anisotropic etching process, the sidewall of the cavity being defined by a remaining portion of the first layer and a remaining portion of the second layer;

epitaxially growing a first semiconductor material on the exposed third portions of the second layer of the substrate in the cavity; and epitaxially growing a raised source/drain region comprising a second semiconductor material on the first semiconductor material.

* * * * *